(12) United States Patent
McNulty et al.

(10) Patent No.: US 7,148,650 B1
(45) Date of Patent: Dec. 12, 2006

(54) MAXIMUM POWER POINT MOTOR CONTROL

(75) Inventors: Thomas Charles McNulty, Ewing, NJ (US); Juan Carlos Horta, Perth Amboy, NJ (US); Joacine Plaisime, Hamilton Township, NJ (US)

(73) Assignee: World Water & Power Corp., Pennington, NJ (US)

( * ) Notice: Subject to any disclaimer, the term of this patent is extended or adjusted under 35 U.S.C. 154(b) by 0 days.

(21) Appl. No.: 11/158,876

(22) Filed: Jun. 22, 2005

(51) Int. Cl.
*H02P 27/06* (2006.01)
*H02M 5/45* (2006.01)
*H01L 31/042* (2006.01)

(52) U.S. Cl. ............... 318/801; 318/800; 318/807; 320/30; 323/906; 136/243; 136/244; 363/74; 363/95

(58) Field of Classification Search ............... None
See application file for complete search history.

(56) References Cited

U.S. PATENT DOCUMENTS

| | | | |
|---|---|---|---|
| 4,494,180 A * | 1/1985 | Streater et al. ............ | 318/801 |
| 4,538,100 A * | 8/1985 | Tuten et al. ............... | 318/808 |
| 4,999,560 A * | 3/1991 | Morishima et al. ......... | 318/779 |
| 5,235,266 A * | 8/1993 | Schaffrin .................. | 323/205 |
| 5,747,967 A * | 5/1998 | Muljadi et al. ............ | 320/148 |
| 6,232,742 B1 * | 5/2001 | Wacknov et al. .......... | 318/811 |
| 6,275,403 B1 | 8/2001 | McNulty et al. | |
| 6,950,323 B1 * | 9/2005 | Achleitner et al. ......... | 363/55 |
| 2005/0067999 A1 * | 3/2005 | Okamura et al. .......... | 318/800 |

FOREIGN PATENT DOCUMENTS

JP 09073328 A * 3/1997

OTHER PUBLICATIONS

D.P. Holm and M.E. Ropp, Comparative Study of Maximum Power Point Tracking Algorithms, Prog. Photvolt: Res. Appl. 2003; 11:47-62.

* cited by examiner

*Primary Examiner*—Lincoln Donovan
*Assistant Examiner*—Eduardo Colon Santana (57) ABSTRACT

A method and apparatus are implemented in software to control motor speed as a function of available power in a DC source-inverter-AC motor system, i.e. to perform maximum power tracking of motor speed. An inverter or motor drive converts DC power from a DC source, such as a solar panel, to AC power, to power the motor. The inverter or motor drive is controlled by software, implemented either by programmable features built directly into the inverter or drive or by a separate programmable device connected to the inverter or drive, to track motor power as a function of source power. The software-controlled inverter or drive sets motor speed as a function of source power by sensing only a single parameter, the DC source voltage. The software-controlled inverter or drive samples the source voltage at preset intervals, and changes the frequency of the AC output of the inverter or drive to match or track the available power so that the motor operates at or near its optimum for any source voltage.

16 Claims, 7 Drawing Sheets

Maximum Power Tracking Timing Diagram

Fig. 6

MAXIMUM POWER POINT MOTOR CONTROL

BACKGROUND OF THE INVENTION

1. Field of the Invention

The present invention relates generally to the operation of AC motors or similar loads with AC motor drives that convert power from a DC source to AC, and more particularly to operation of the motor at maximum power as the power from the DC source varies. A particular application is to solar powered systems and to water pumps.

2. Description of Related Art

An AC load can be powered from a DC source by using a converter to change DC to AC. However, because of changes in both the source and the load, it can be difficult to meet the power requirements of the load. For example, a photovoltaic solar cell array is a DC source. However, the current-voltage (I-V) curve shifts under varying conditions, e.g. amount of sun. Thus the available power will vary. One application of solar power is to operate water pumps, which typically include three phase AC motors. However, the load curve of the AC pump motor can also shift with varying conditions, e.g. water depth. Thus it can be difficult to efficiently operate an AC pump from a solar array.

A solar powered water pumping system typically has three primary components: the solar array, made of photovoltaic (PV) modules; a converter (inverter or motor drive) which converts the DC from the PV array to AC; and an AC motor (pump). The motor typically runs at a particular frequency (speed), e.g. 60 Hz. The converter will usually be set to provide AC power at that particular frequency. The motor will run at a speed equal to the AC frequency.

In operation, the motor demands power. The motor pumps the most water when it is at the maximum power point. As the solar array output changes, e.g. decreases from a maximum to a lower voltage, the I-V power curve changes, but there is always a maximum power point. However, if the motor continues to run at the same speed, e.g. 60 Hz, then as the voltage drops, the current must increase to meet the power requirements, until the increased current can damage the motor.

Thus, controlling motors at fixed frequency is very difficult. If the power is to remain constant at a given frequency, then a change in DC voltage must be accompanied by a change in DC current. If the voltage decreases, the current must increase, which results in a further voltage decrease and current increase until a point is reached where a shutdown must occur to prevent motor damage or increased heat or other related damage.

In general, it is desirable to operate at the maximum power point (MPP) on a power curve. However, it is difficult to track power. Power tracking generally requires detecting two parameters, current (I) and voltage (V), and measuring changes in the product (IV).

If the motor operates at a reduced frequency, then it requires less power. While this is not as good as operating at full power, the motor can be kept operating at the maximum operating frequency for the existing conditions, without damaging the motor. Therefore, it is desirable to provide a method and apparatus to operate an AC motor from a motor drive by changing the AC frequency and thus the motor speed to correspond to the available power.

U.S. Pat. No. 6,275,403 is directed to a bias control circuit connected to a DC to AC converter to control motor frequency of a connected motor by applying a bias voltage to the converter to control the frequency of the AC output of the converter. The bias control circuit is responsive to the DC voltage from a DC source, e.g. solar array, connected to the converter. The system is designed to operate an AC motor or other load from a DC source under varying source and/or load conditions. In a preferred embodiment, the bias control circuit has a multistage configuration and provides bias voltages at a plurality of discrete DC source voltages. Thus the system, while providing significant improvement in motor operation, requires an additional hardware circuit, and operates at a number of discrete levels limited by the number of stages in the circuit.

Accordingly it is desirable to provide a simple system for controlling the motor speed to better match the maximum power point without having to measure power. It would also be desirable to provide a system which is implemented in software and eliminates the need for additional hardware circuits.

SUMMARY OF THE INVENTION

The invention is method and apparatus implemented in software to control motor speed as a function of available power in a DC source-inverter-AC motor system, i.e. to perform maximum power tracking of motor speed. An inverter or motor drive is used to convert DC power from a DC source, such as a solar panel, to AC power, which powers the motor. The inverter or motor drive is controlled by software, implemented either by programmable features built directly into the inverter or drive or by a separate programmable device connected to the inverter or drive, to track motor power as a function of source power. The software-controlled inverter or drive sets motor speed as a function of source power by sensing only a single parameter, the DC source voltage, which is input into the inverter or drive. The software-controlled inverter of the invention samples the source voltage at preset intervals, and changes the frequency of the AC output of the inverter or drive to match or track the available power so that the motor operates at or near its optimum for any source voltage.

An aspect of the invention is an apparatus for converting DC power from a DC source to AC power to drive an AC motor, formed of a software-controlled inverter which produces an AC output from a DC input, wherein the software-controlled inverter carries out an algorithm for varying the AC output frequency in response to changes in the DC voltage from the DC source so that the speed of an AC motor driven by the inverter tracks the maximum power available from the DC source.

Another aspect of the invention is a system including a DC source; a software-controlled inverter connected to the DC source to produce an AC output from a DC input; and an AC motor connected to the AC output from the inverter; wherein the software-controlled inverter carries out an algorithm for varying the AC output frequency in response to changes in the DC voltage from the DC source so that the speed of the AC motor tracks the maximum power available from the DC source.

A further aspect of the invention is a method for powering an AC motor from a DC source by obtaining DC power from a DC source; converting the DC power to AC power; powering the AC motor with the AC power; and varying the AC frequency in response to changes in the DC voltage from the DC source so that the speed of the AC motor tracks the maximum power available from the DC source.

DETAILED DESCRIPTION OF THE INVENTION

Figure 1A:
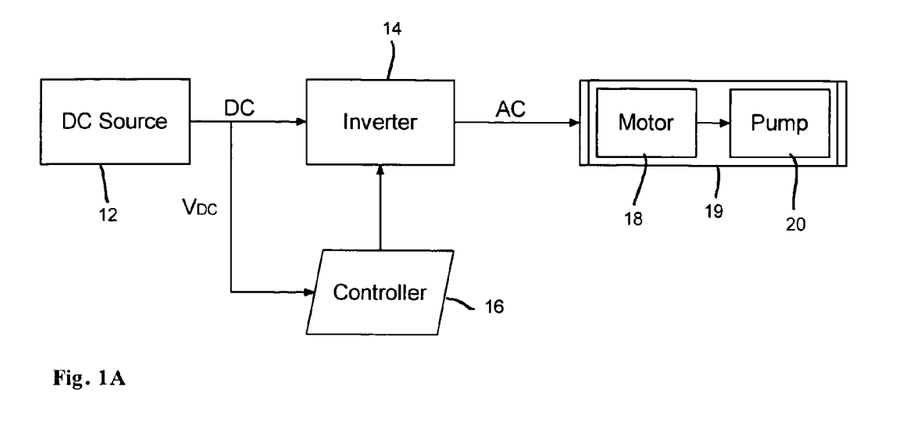
FIG. 1A is a block diagram of a DC source-software controlled inverter-AC motor system of the invention, with a separate controller.

As shown in FIG. 1A, a DC source-software controlled inverter-AC motor system 10 according to the invention comprises a DC source 12, an inverter 14 connected to the DC source 12, a programmed controller 16 connected to the inverter 14, and an AC motor 18 connected to the inverter 14. DC source 12 is preferably a solar array made up of conventional silicon solar cells or panels, but may be another type of DC source. The DC source will generally be a source whose output voltage and power vary. The AC motor is typically a three phase motor, and may drive a water pump 20 (or other device), which may be combined with motor 18 into a single integral unit 19. The invention may also be applied to other loads that have load characteristics similar to motor 18.

Figure 1B:
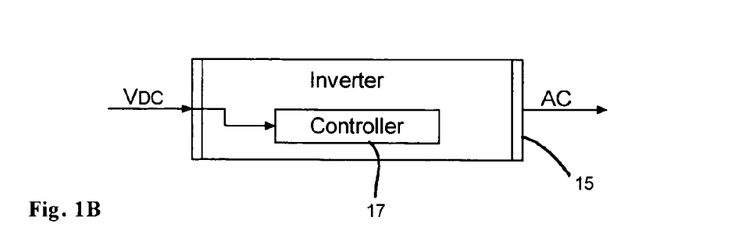
FIG. 1B is a block diagram of an alternate embodiment of the software controlled inverter, with an internal controller.

Inverter 14 is a conventional DC to AC converter, also commonly known as a motor drive or variable speed drive (VFD). Controller 16 is programmed to carry out an algorithm which produces maximum power point tracking by varying the AC output frequency from the inverter 14 as a function of the DC source voltage. In an alternate embodiment of the invention, inverter 14 and controller 16 are replaced by inverter 15 with an internal controller 17, as shown in FIG. 1B, i.e. the inverter is itself programmable and does not need an external controller. Controller 17 is programmed to carry out an algorithm which produces maximum power point tracking by varying the AC output frequency from the inverter 15 as a function of the DC source voltage. In either embodiment, the DC to AC converter is software-controlled and carries out an algorithm to vary the AC frequency so that the motor is operated at the maximum power that is at that moment available from the DC source. The motor speed changes as the available power from the DC source changes. The invention includes the software-controlled inverter and the DC source-software controlled inverter-AC motor system.

Figure 2:
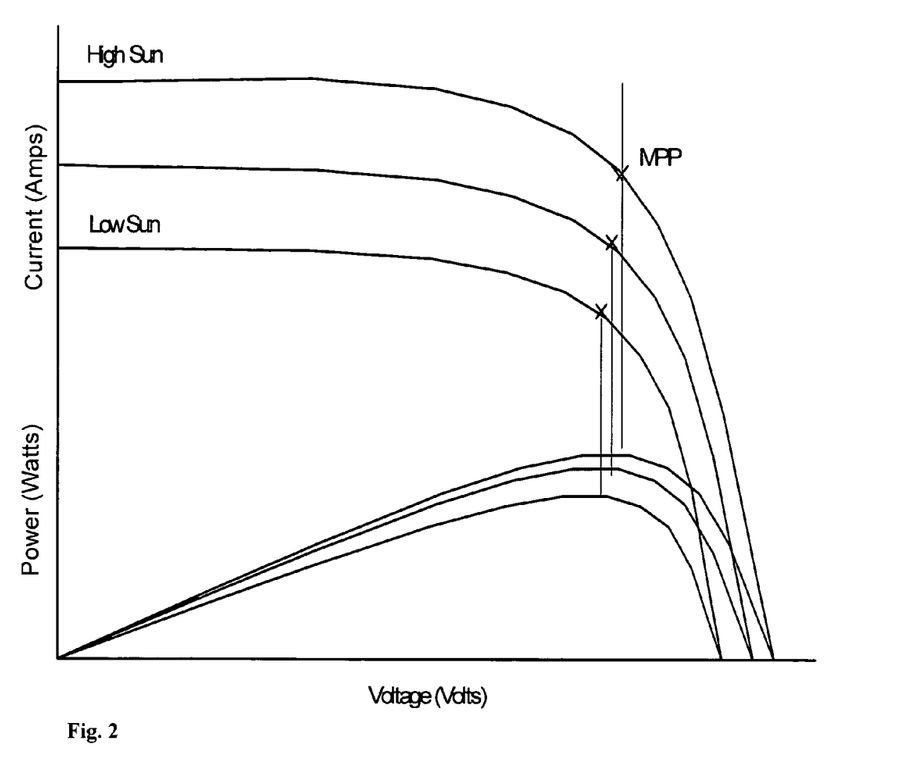
FIG. 2 is a series of current (I) vs. voltage (V) curves for a PV solar array with the maximum power point (MPP) and associated power (P) vs. voltage (V) curves also shown.

FIG. 2 shows several current (I) vs. voltage (V) curves for a PV solar array, ranging between high sun and low sun conditions. The maximum power points (MPPs) and some associated power (P) vs. voltage (V) curves are also shown. The MPP is the point on a particular I-V curve where $P(=I \times V)$ is a maximum. The motor being powered from the PV array can do the most work when it is at the MPP.

As the solar array output changes, and the associated I-V curve changes, the MPP changes. To optimize motor performance, it is necessary to adjust to the change in MPP. The invention provides a way for the motor to track the MPP. This is accomplished by measuring the DC voltage, and changing the AC frequency (and thus motor speed) in response thereto.

Figure 3A:
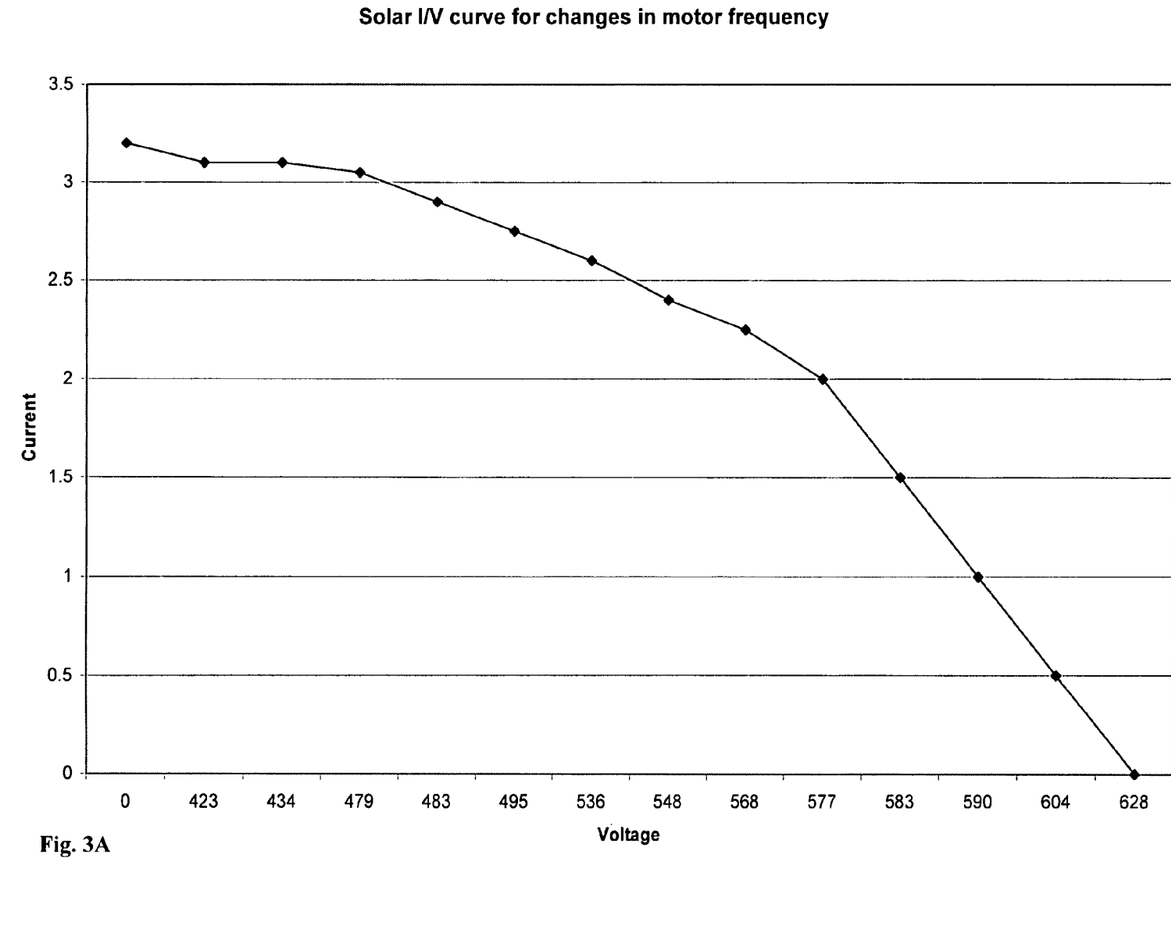
FIG. 3A is a graph of measured I-V for changes in motor frequency.

FIG. 3A shows a solar I-V curve for changes in motor frequency. Tests were run at different frequencies and the power requirements, i.e. maximum IV, were logged at each frequency. The curve ranges from zero frequency, where the solar voltage is the open circuit voltage Voc and the solar current is zero, to the maximum frequency. At the other limit the solar voltage is zero and the solar current is the short circuit current Isc (but a motor would stall before reaching that point). The graph shows that the motor can be controlled for maximum power available from a solar source (or other variable DC source).

In accordance with the invention, the motor is allowed to operate at a frequency compatible with source power, but this is done without actually sampling the source power. Instead, only the source voltage is sampled, and on the basis of changes in the source voltage the motor speed is decreased or increased to track lower or higher power availability.

Figure 3B:
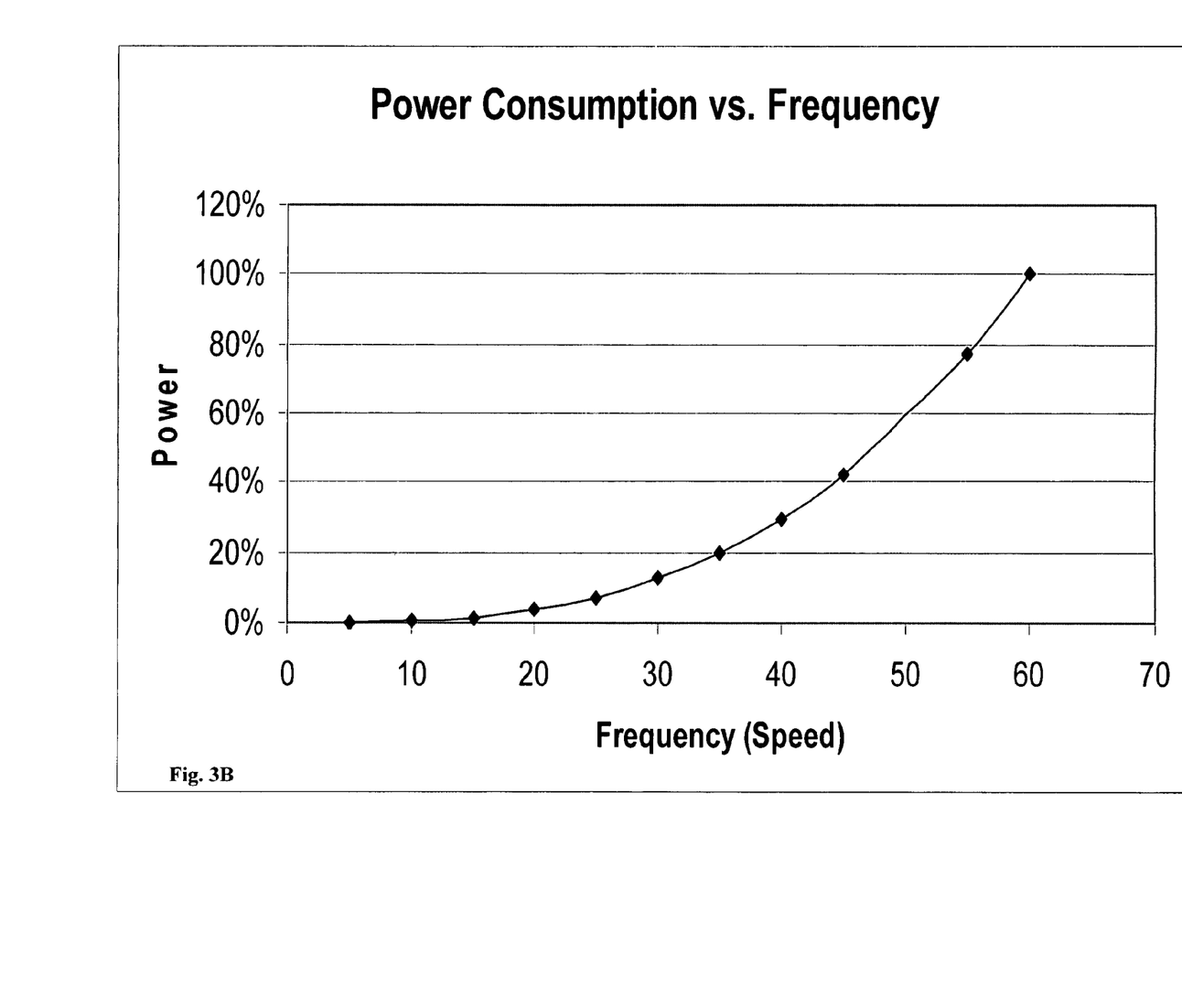
FIG. 3B is a graph of power consumption vs. frequency.

FIG. 3B shows a power consumption curve as a function of frequency. Motors in the U.S. are designed to operate at 60 Hz AC frequency at rated power. If the motor power available is less than the power required at 60 Hz, the motor will try to maintain constant power by increased current consumption to compensate for the reduction in source voltage. This will add to excessive power losses and eventual motor damage. To correct this problem, motor speed must be reduced. As shown in FIG. 3B, at full power the motor can operate at full speed (60 Hz) but at 80% power the motor speed must be reduced to about 55 Hz and at 60% power the motor speed must be reduced to about 50 Hz. The invention provides a simple method and apparatus for adjusting motor speed to track available source power.

Figure 4:
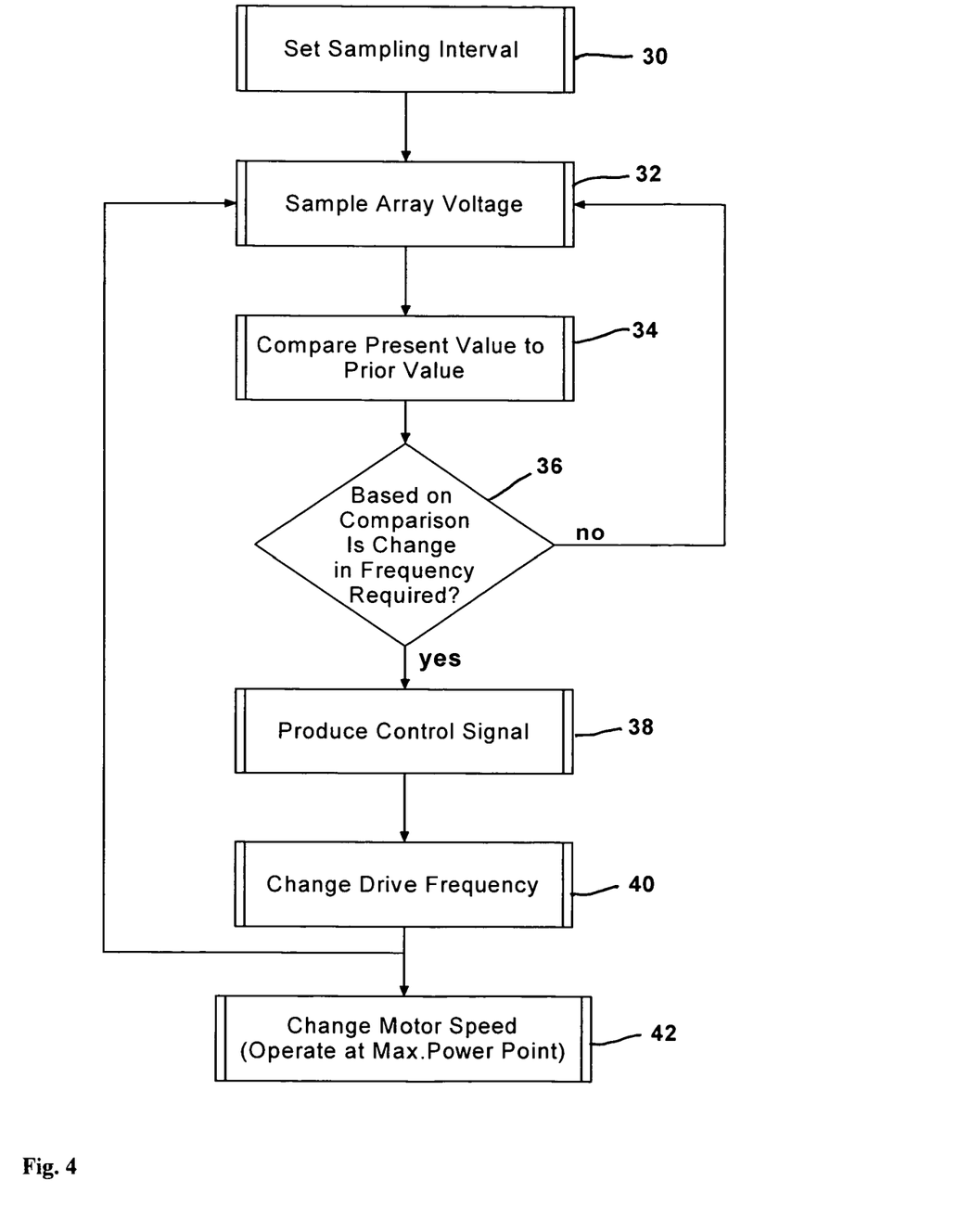
FIG. 4 is a flow chart of a maximum power point algorithm used by the invention.

FIG. 4 presents a flow chart of an algorithm which is implemented by the software controlled inverter of the invention to carry out maximum power point tracking. As a preliminary step 30, a sampling interval ($\Delta t$) is set. The sampling interval should be relatively short so that the motor speed closely follows the available power but cannot be so short that the motor operation becomes unstable because of very rapid fluctuations in power or that the motor cannot respond because of motor inertia. A suitable $\Delta t$ is in the range of about 1 to 5 sec. The sampling interval can be reset as desired.

In step 30, the array voltage (AV) is sampled. Sampling is done at the sampling interval set in step 30. In step 34, the present value of the array voltage is compared to the previously sampled value, i.e. the difference $\Delta AV = AV(n) - AV(n-1)$ is computed. (On the initial AV sample when the system is first turned on, there is no previous value of AV to compare so the difference is zero.)

In step 36, a decision as to whether a change in frequency is required is made, based on the comparison made in step 34. A comparison is made as to whether the measured $\Delta AV$ is greater than or equal to a preset threshold value $\Delta AV$ (threshold). The value $\Delta AV$(threshold) represents the minimum change in voltage (and power) for which the motor speed should be changed. It should be relatively low so that the motor speed closely follows the available power but cannot be so small that the system tries to respond to insignificant changes in voltage (power). A suitable value is in the range of about 10 to 25 volts.

If the measured ΔAV is less than ΔAV(threshold), then no change in AC frequency or motor speed is required, and the algorithm returns to step 32, takes the next voltage sample, and continues on through step 34 to step 36 again. If the measured ΔAV is greater than or equal to ΔAV(threshold), then a change in AC frequency and motor speed is required.

In response to a Yes decision in step 36, a control signal is produced in step 38. The control signal may be generated internal to the inverter, as in FIG. 1B, or may be generated in a separate controller, as in FIG. 1A. In response to the control signal, the inverter changes the AC frequency of its output, in step 40. The change in AC frequency changes the motor speed, step 42, so that the motor speed tracks the maximum power available from the source. After the AC frequency is changed in step 40, the algorithm returns to step 32 and goes through another cycle. The general process of the algorithm shown in FIG. 4 can be carried out in many different specific software implementations.

The invention includes a method for powering an AC motor from a DC source, e.g. solar panel, by obtaining DC power from the DC source; converting the DC power to AC power; powering the AC motor with the AC power; and varying the AC frequency in response to changes in the DC voltage from the DC source so that the speed of the AC motor tracks the maximum power available from the DC source. The method may be carried out with an algorithm made up of a series of instructions for sequentially sampling the DC source voltage at a preset sampling interval, comparing the present sampled value of the DC voltage to the prior sampled value, determining whether a change of AC frequency is required based on the comparison of the present to the prior sampled DC voltages, producing a control signal if a change in AC frequency is required, changing the AC frequency in response to the control signal, and continuously repeating the series of instructions.

Figure 5:
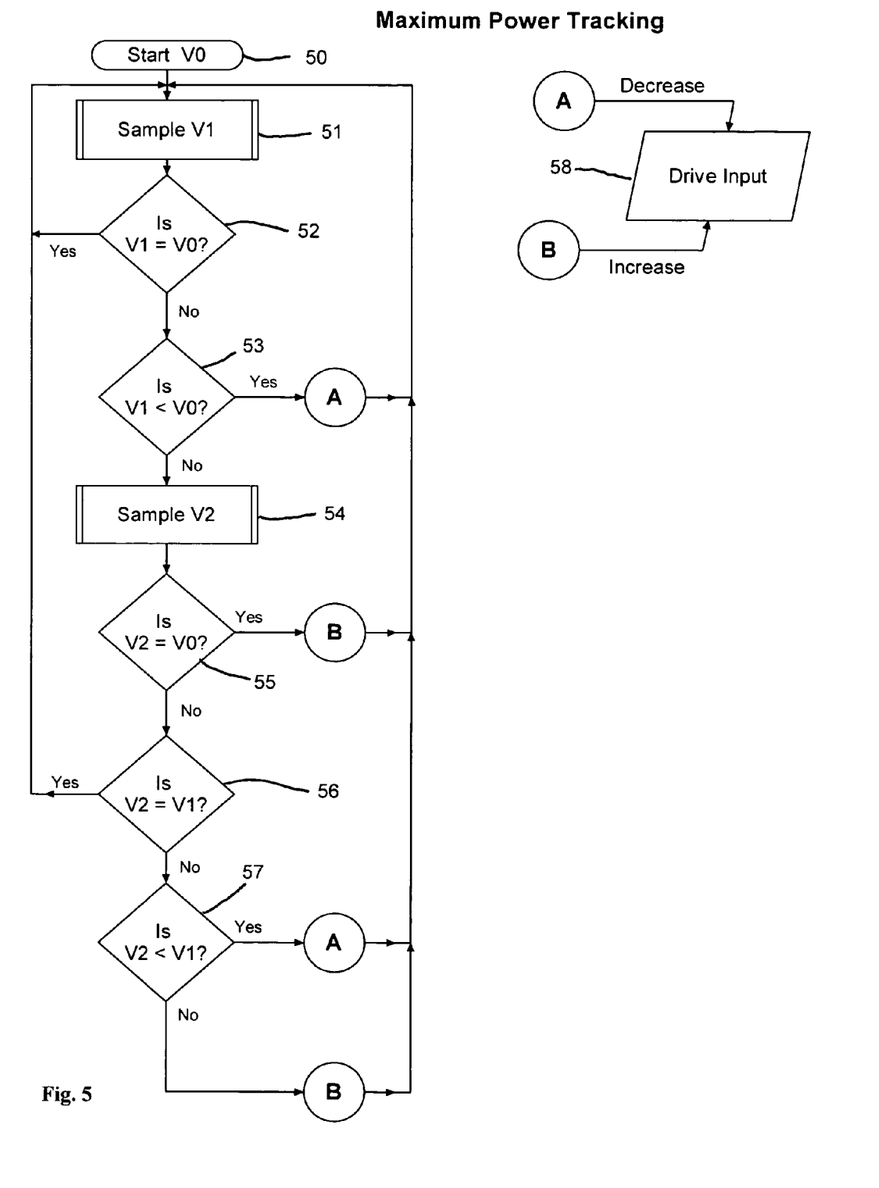
FIG. 5 is a flow chart of some specific steps in an algorithm for maximum power tracking.
Figure 6:
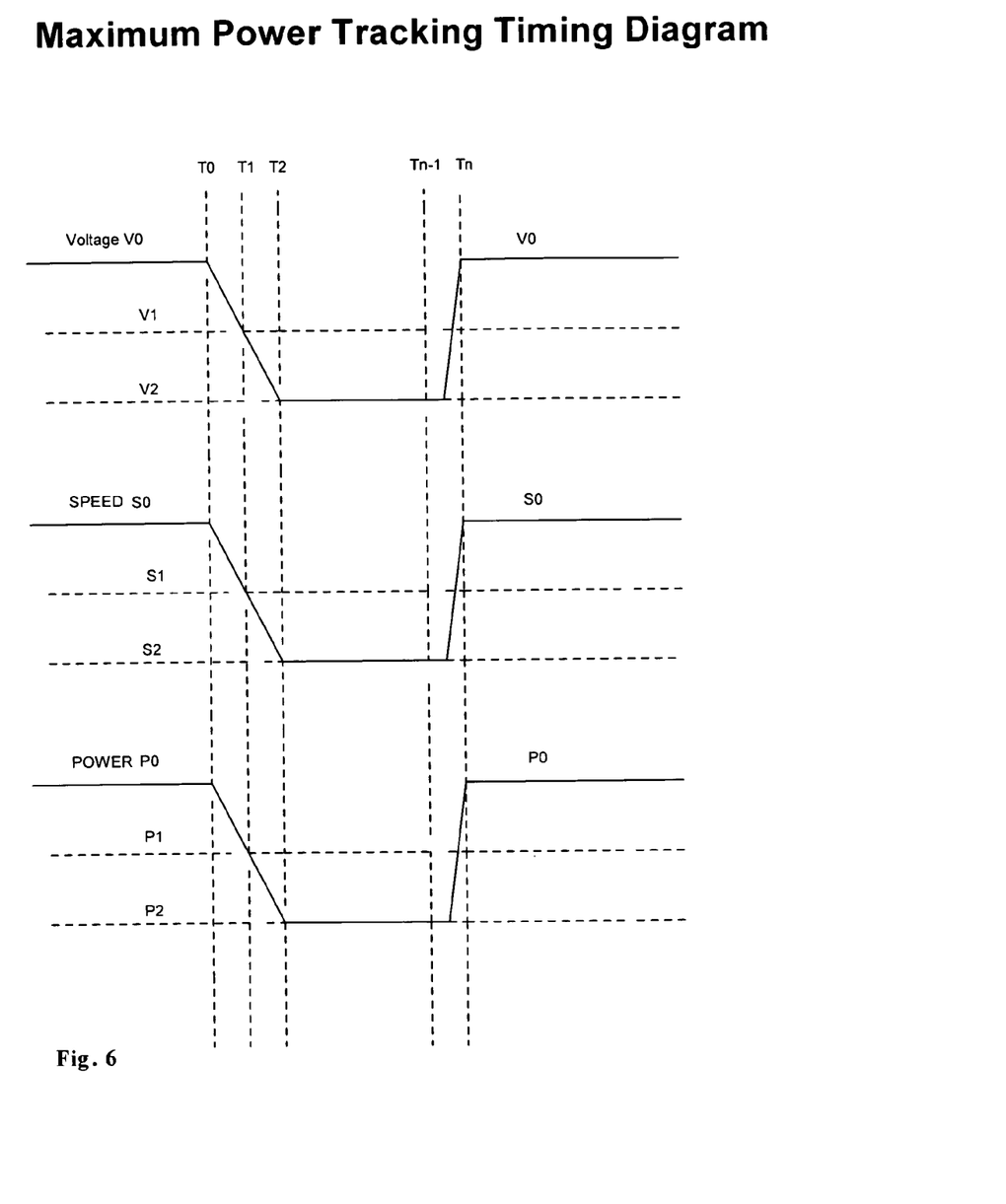
FIG. 6 is a maximum power tracking timing diagram for the specific steps of the algorithm of FIG. 5.

A specific sequence of steps illustrating a portion of a particular algorithm for maximum power point tracking is shown in FIG. 5, and an illustrative associated wave form and timing diagram is shown in FIG. 6. This sequence starts with an initial array voltage V0 (the maximum voltage), step 50, at t0. A first voltage sample V1 is taken at time t1, step 51. A first comparison is made, "is V1=V0", step 52. If the answer to step 52 is Yes (V1=V0), then the voltage is still at its initial value, so return to step 51, and take sample V1 again. If the answer to step 52 is No, then perform a second comparison, "is V1<V0", step 53. If the answer is Yes, then the voltage has decreased from the initial (rated) value and the available power is less, so the motor speed should decrease. Signal A to drive input 58 will change the AC frequency of the drive. Also return to step 51 and start a new cycle. If the answer is No, then a second voltage sample V2 is taken, step 54, at t2. (The test "is V1>V0" is not necessary since V0 is the maximum voltage. The comparisons may actually involve some thresholds as discussed with FIG. 4, but for simplicity to illustrate the basic logic of the process, they are not included.)

The second voltage sample now goes through a sequence of comparisons. Step 55, "is V2=V0". If Yes, then the voltage has returned to the initial maximum voltage V0 so the speed must be increased back to its initial speed. Signal B to drive input 58 will increase the AC frequency, back to the initial frequency. Also return to step 51 and start a new cycle. If No, then "is V2=V", step 56. If Yes, then the voltage has not changed from the prior value, so return to step 51 and begin a new cycle. If No, then "is V2<V1", step 57. If Yes, then the array voltage has decreased again, and the available power is even less, so the motor speed should be decreased further. Signal A to drive input 58 results in a further decrease in motor speed. Also return to step 51 and start a new cycle. If No, then V2>V1, the voltage has increased since the last voltage sample (but not to V0) so the speed should be increased, using signal B. Again return to step 51 and start a new cycle.

FIG. 6 shows illustrative Voltage (V), Speed (S) and Power (P) wave forms for the process illustrated in FIG. 5. At the initial time t0, V is at its maximum value V0 so S and P are at their maximums S0 and P0. The voltage sampling and speed adjustment is done at a sequence of times t1, t2, t3 . . . t(n−1), t(n) defined by a sampling interval. At sample time t1, V has decreased to V1 and P to P1 so the speed must be reduced to S1. At sample time t2, the V and P have decreased further to V2 and P2 so the speed must be further reduced to S2. V, S, and P then remain constant up to sample time t(n−1). But at sample time t(n), V and P have increased back to their maximum values V0, P0 so S must be increased back to S0. The method of FIG. 5 will allow S to track P using V.

Changes and modifications in the specifically described embodiments can be carried out without departing from the scope of the invention which is intended to be limited only by the scope of the appended claims.

The invention claimed is:

1. Apparatus for converting DC power from a DC source to AC power to drive an AC motor, comprising:
    a software-controlled inverter which produces an AC output from a DC input;
    wherein the software-controlled inverter carries out an algorithm for varying the AC output frequency in response to changes in the DC voltage from the DC source so that the speed of an AC motor driven by the inverter tracks the maximum power available from the DC source;
    wherein the algorithm comprises a series of instructions for sequentially:
    sampling the DC source voltage at a preset sampling interval,
    comparing the present sampled value of the DC voltage to the prior sampled value,
    determining whether a change of AC frequency is required based on the comparison of the present to the prior sampled DC voltages,
    producing a control signal if a change in AC frequency is required,
    changing the AC frequency in response to the control signal, and
    continuously repeating the series of instructions.

2. The apparatus of claim 1 wherein the software-controlled inverter is internally programmable with the algorithm and produces internal control signals to change the AC output frequency of the inverter.

3. The apparatus of claim 1 wherein the software-controlled inverter comprises an inverter and a separate controller connected to the inverter which is programmable with the algorithm and produces control signals that are input into the inverter to change the AC output frequency of the inverter.

4. The apparatus of claim 1 wherein a change in AC frequency is required when the present value of the sampled DC voltage exceeds the prior value by a preset amount.

5. A system comprising:
a DC source;
a software-controlled inverter connected to the DC source to produce an AC output from a DC input;
an AC motor connected to the AC output from the inverter;
wherein the software-controlled inverter carries out an algorithm for varying the AC output frequency in response to changes in the DC voltage from the DC source so that the speed of the AC motor tracks the maximum power available from the DC source;
wherein the algorithm comprises a series of instructions for sequentially:
sampling the DC source voltage at a preset sampling interval,
comparing the present sampled value of the DC voltage to the prior sampled value,
determining whether a change of AC frequency is required based on the comparison of the present to the prior sampled DC voltages,
producing a control signal if a change in AC frequency is required,
changing the AC frequency in response to the control signal, and
continuously repeating the series of instructions.

6. The system of claim 5 wherein the DC source is a solar array.

7. The system of claim 6 further comprising a water pump driven by the AC motor.

8. The system of claim 5 wherein the software-controlled inverter is internally programmable with the algorithm and produces internal control signals to change the AC output frequency of the inverter.

9. The system of claim 5 wherein the software-controlled inverter comprises an inverter and a separate controller connected to the inverter which is programmable with the algorithm and produces control signals that are input into the inverter to change the AC output frequency of the inverter.

10. The system of claim 5 wherein a change in AC frequency is required when the present value of the sampled DC voltage exceeds the prior value by a preset amount.

11. The system of claim 5 wherein the DC source is a solar array.

12. The system of claim 11 further comprising a water pump driven by the AC motor.

13. A method for powering an AC motor from a DC source comprising:
obtaining DC power from a DC source;
converting the DC power to AC power;
powering the AC motor with the AC power;
varying the AC frequency in response to changes in the DC voltage from the DC source so that the speed of the AC motor tracks the maximum power available from the DC source;
wherein the AC frequency is varied by carrying out an algorithm in a software-controlled inverter;
wherein the algorithm comprises a series of instructions for sequentially:
sampling the DC source voltage at a preset sampling interval,
comparing the present sampled value of the DC voltage to the prior sampled value,
determining whether a change of AC frequency is required based on the comparison of the present to the prior sampled DC voltages,
producing a control signal if a change in AC frequency is required,
changing the AC frequency in response to the control signal, and
continuously repeating the series of instructions.

14. The method of claim 13 wherein the DC power is obtained from a solar array.

15. The method of claim 14 further comprising driving a water pump with the AC motor.

16. The method of claim 13 wherein a change in AC frequency is required when the present value of the sampled DC voltage exceeds the prior value by a preset amount.

* * * * *